(12) United States Patent
Sugishita

(10) Patent No.: US 7,911,858 B2
(45) Date of Patent: Mar. 22, 2011

(54) SEMICONDUCTOR DEVICE WITH DDR MEMORY CONTROLLER

(75) Inventor: Kyosuke Sugishita, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 217 days.

(21) Appl. No.: 12/256,024

(22) Filed: Oct. 22, 2008

(65) Prior Publication Data
US 2009/0109770 A1 Apr. 30, 2009

(30) Foreign Application Priority Data

Oct. 24, 2007 (JP) ................................ 2007-276184

(51) Int. Cl.
*G11C 7/00* (2006.01)
*G11C 8/02* (2006.01)
(52) U.S. Cl. ..... 365/191; 365/193; 365/194; 365/233.1; 365/233.11; 365/233.13
(58) Field of Classification Search .................. 365/191, 365/193, 194, 233.1, 233.11, 233.13
See application file for complete search history.

(56) References Cited

U.S. PATENT DOCUMENTS

| 6,665,230 B1 * | 12/2003 | Shrader et al. ........... 365/233.13 |
| 2003/0076125 A1 * | 4/2003 | McCord ........................ 324/765 |
| 2009/0085618 A1 * | 4/2009 | Schneider et al. ............ 327/143 |
| 2009/0085623 A1 * | 4/2009 | Schneider et al. ............ 327/161 |

FOREIGN PATENT DOCUMENTS

JP 2004-220643 A 8/2004

OTHER PUBLICATIONS

Micron Technology Inc., "DDR SDRAM Functionality and Controller Read Data Capture," DesignLine, 3Q 1999, p. 1-24, vol. 8, issue 3.

* cited by examiner

*Primary Examiner* — Ly D Pham
(74) *Attorney, Agent, or Firm* — Sughrue Mion, PLLC

(57) ABSTRACT

In a DDR memory controller, a clock control circuit is configured to output a clock signal selected from among a plurality of clock signals with different frequencies based on a frequency selection signal, to a DDR memory as an operation clock signal. A master DLL circuit is configured to receive one of the plurality of clock signals which has a maximum frequency as a reference clock signal to determine a delay code. A slave delay circuit is configured to delay a strobe signal from the DDR memory based on the determined delay code to generate an internal strobe signal for a data signal from the DDR memory.

14 Claims, 10 Drawing Sheets

SEMICONDUCTOR DEVICE WITH DDR MEMORY CONTROLLER

CORPORATION BY REFERENCE

This Patent Application claims priority on convention based on Japanese Patent Application No. 2007-276184. The disclosure thereof is incorporated herein by reference.

BACKGROUND OF THE INVENTION

1. Field of the Invention

The present invention relates to a memory controller for a DDR (Double Data Rate) memory and a semiconductor device mounted with the memory controller.

2. Description of Related Art

As a type of an SDRAM (Synchronous Dynamic Random Access memory), a DDR (Double Data Rate)-SDRAM is known which can transfer data at high speed. Hereinafter, the DDR-SDRAM is referred to as a "DDR memory". In addition, a memory controller for the DDR memory is hereinafter referred to as a "DDR memory controller".

In the high-speed data transfer between the DDR memory and the DDR memory controller, a special signal called a "strobe signal" is used. Specifically, a data sending side outputs the strobe signal together with a data signal. The strobe signal repeats a toggle operation between a high level and a low level each time the data signal is outputted. However, it is a different signal from a clock signal. A data receiving side receives the data signal in response to not the clock signal but the received strobe signal. For example, in data read, the DDR memory outputs the strobe signal in addition to the data signal indicating read data. In response to the received strobe signal, the DDR memory controller latches a received data signal at timings of a rising edge and a falling edge of the strobe signal. At this time, in order to latch the data signal in a stable state, the DDR memory controller delays the received strobe signal and latches the data signal in response to the delayed strobe signal. As a method for delaying the strobe signal, a method of using a DLL (Delay Locked Loop) circuit and a delay circuit is well known, as shown in Japanese Patent Application Publication (JP-P2004-220643A, related art 1) and DesignLine, Volume 8, Issue 3, 3Q99, Micron Technology Inc. (related art 2).

FIG. 1 shows a DDR memory controller 140 shown in the related art 1. The DDR memory controller 140 receives a data signal DQ and a strobe signal DQS outputted from a DDR memory. The data signal DQ is a signal of 8 bits (DQ0 to DQ7). As shown in FIG. 1, the DDR memory controller 140 includes a slave delay circuit 110, a master DLL circuit 120, and a gear ratio logic circuit 130.

The slave delay circuit 110 is a circuit for delaying the strobe signal DQS received from the DDR memory. Specifically, the slave delay circuit 110 has a variable delay circuit whose number of delay stages is changed based on a delay code, and delays the strobe signal DQS by a delay time tSD determined based on the number of delay stages. A group of flip-flops latch the data signal DQ In response to a rising edge or a falling edge of the strobe signal DQS outputted from the slave delay circuit 110. In order to latch the data signal DQ in a steady state, the number of delay stages (the delay time tSD) is specifically set so that a phase of the strobe signal DQS can be shifted by approximately 90 degrees. In other words, the delay code is determined so that the phase of the strobe signal DQS can be shifted by approximately 90 degrees.

Here, it should be noted that a characteristic of a delay element of the delay circuit depends on a temperature and a manufacture variation. That is, the delay time tSD may vary depending on the temperature and the manufacture variation even in case of an identical delay code (the number of delay stages). In order to align the delay time tSD to a same time length for semiconductor chips, it is required to adjust (trim) the delay code for each of the semiconductor chips. A configuration for performing such trimming of the delay code is realized by the master DLL circuit 120 and the gear ratio logic circuit 130.

The master DLL circuit 120 receives an operation clock signal CK of the DDR memory as a reference clock signal, and calculates the number of delay stages at which a phase of the reference clock signal CK is shifted by 360 degrees (a single period). Specifically, the master DLL circuit 120 has a variable delay circuit, a phase detector, and a delay controller. The variable delay circuit has a same configuration as that of the above-mentioned slave delay circuit 110, and the number of delay stages changes depending on a control signal outputted from the delay controller. The variable delay circuit receives the reference clock signal CK and delays the reference clock signal CK for the delay time tCK based on the set number of delay stages. The reference clock signal CK that is not delayed and the delayed reference clock signal CK outputted from the variable delay circuit are supplied to the phase detector. The phase detector compares the phases of the two reference clock signals CK and outputs a comparing result to the delay controller. The delay controller changes the control signal based on the comparing result and varies the number of delay stages in the variable delay circuit. According to such a configuration, the number of delay stages realizing a delay of the reference clock signal CK for a single period can be determined.

The gear ratio logic circuit 130 divides the number of delay stages for realizing the delay of the reference clock signal CK for the single period by "4". As the result, the number of delay stages is calculated when the phase of the reference clock signal CK can shift by 90 degrees. A signal indicating the calculated number of delay stages is the delay code in the semiconductor chip. The slave delay circuit 110 sets the number of delay stages on the basis of the determined delay code and delays the strobe signal DQS for the delay time tSD.

According to this, the master DLL circuit 120 and the gear ratio logic circuit 130 performs the trimming of the delay code for each of the semiconductor chips. As the result, the delay time tSD of the strobe signal DQS in the slave delay circuit 110 will be aligned for the respective semiconductor chips. That is, the temperature of an operation environment and the manufacture variation can be dealt with.

In recent years, it is desired to operate the DDR memory at various operation frequencies. For example, it is desired to decrease the operation frequency of the DDR memory to reduce the consumed power when data is not read so frequently. According to the configuration shown in FIG. 1, when the operation clock signal CK of the DDR memory is changed, the above mentioned delay code is accordingly reset to an appropriate value. Thus, the DDR memory controller can stably take the data signal DQ therein even when the frequency of the operation clock signal of the DDR memory is changed.

However, resetting (re-trimming) of the delay code takes a certain amount of time. Accordingly, during the resetting of the delay code, the DDR memory is required to be set to a waiting state, resulting in deterioration of throughput. That is, a temporal overhead caused by the resetting of the delay code according to a change of the operation frequency of the DDR memory causes the deterioration of throughput.

SUMMARY

In an aspect of the present invention, a DDR memory controller includes a clock control circuit configured to output a clock signal selected from among a plurality of clock signals with different frequencies based on a frequency selection signal, to a DDR memory as an operation clock signal; a master DLL circuit configured to receive one of the plurality of clock signals which has a maximum frequency as a reference clock signal to determine a delay code; and a slave delay circuit configured to delay a strobe signal from the DDR memory based on the determined delay code to generate an internal strobe signal for a data signal from the DDR memory.

In another aspect of the present invention, a DDR memory controller includes a clock control circuit configured to output one of a plurality of clock signals with different frequencies to a DDR memory as an operation clock signal; and a strobe delay circuit configured to delay a strobe signal outputted from the DDR memory by a predetermined delay time. The delay time is adjusted such that a phase of one of the plurality of clock signals which has a maximum frequency is shifted by a predetermined angle.

In still another aspect of the present invention, a semiconductor integrated circuit includes a DDR memory; and A DDR memory controller. The DDR memory controller includes a clock control circuit configured to output a clock signal selected from among a plurality of clock signals with different frequencies based on a frequency selection signal, to the DDR memory as an operation clock signal; a master DLL circuit configured to receive one of the plurality of clock signals which has a maximum frequency as a reference clock signal to determine a delay code; and a slave delay circuit configured to delay a strobe signal from the DDR memory based on the determined delay code to generate an internal strobe signal for a data signal from the DDR memory.

According to the present invention, a temporal overhead according to a change of the operation frequency of the DDR memory is shortened. As the result, deterioration of throughput is prevented and an operational speed is totally improved.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a DDR memory controller and a semiconductor device according to embodiments of the present invention will be described with reference to the attached drawings.

First Embodiment 1-1. Entire Configuration

Figure 1:
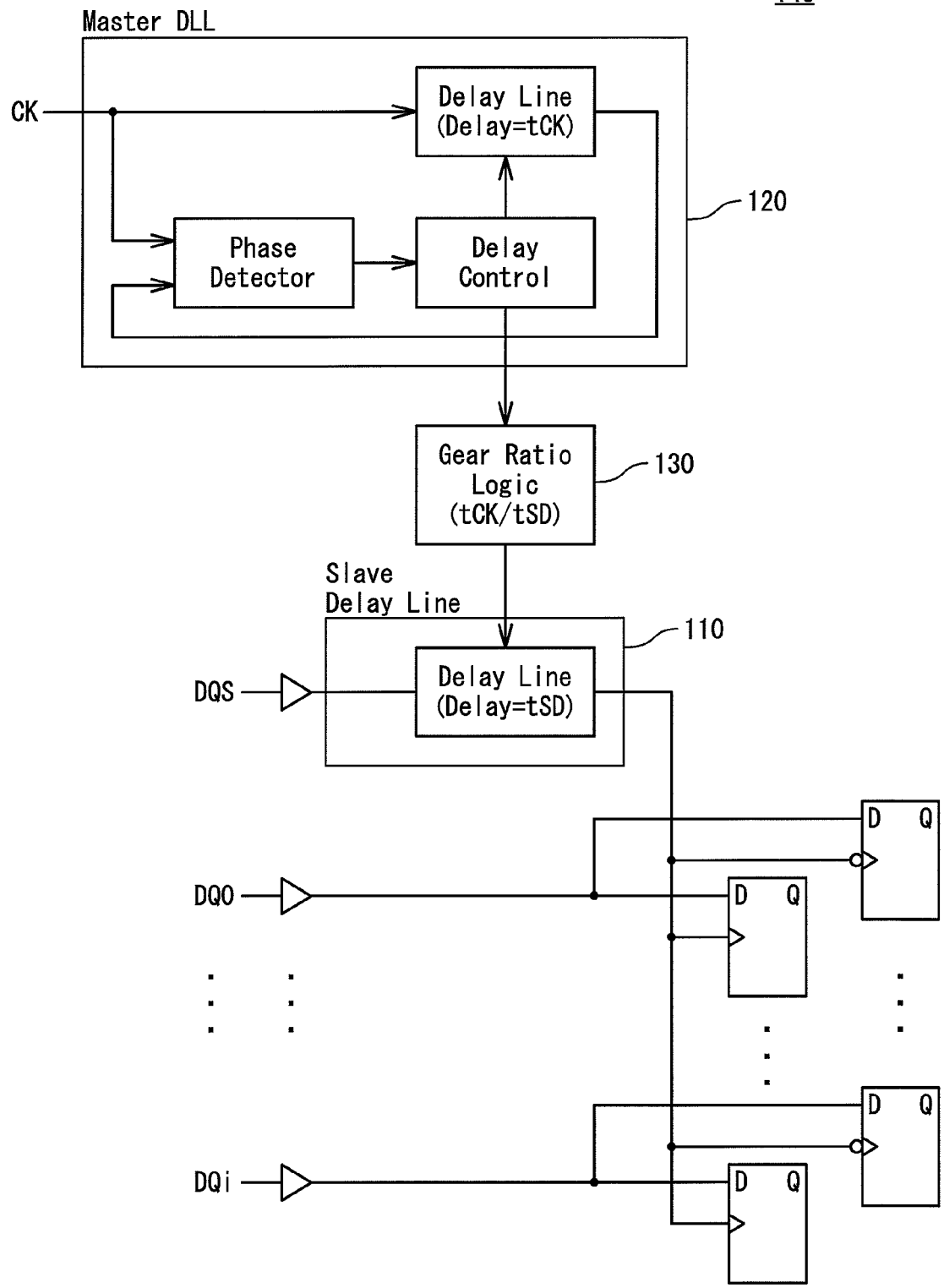
FIG. 1 is a block diagram showing a configuration of a DDR memory controller in a conventional technique.
Figure 2:
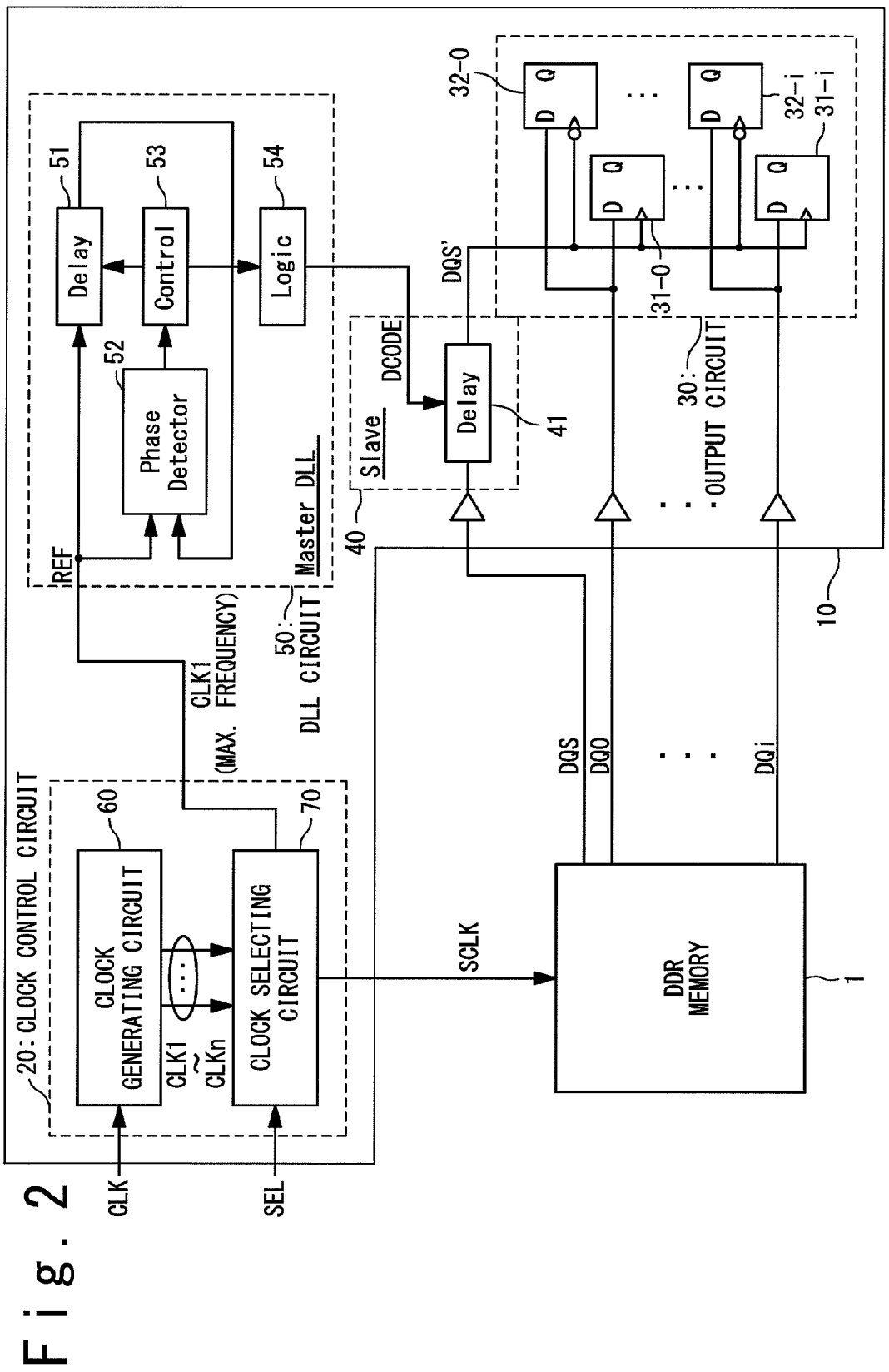
FIG. 2 is a block diagram showing a configuration of a semiconductor device according to a first embodiment of the present invention.

FIG. 2 is a block diagram showing a configuration of a semiconductor device according to a first embodiment of the present invention. The semiconductor device includes a DDR memory (DDR-SDRAM) 1 and a DDR memory controller 10. For example, the DDR memory 1 and the DDR memory controller 10 are formed as separate semiconductor chips, respectively. In addition, the DDR memory controller 10 may be mounted on a logic semiconductor chip. That is, a semiconductor integrated circuit mounting the DDR memory controller 10 may be provided. Furthermore, the DDR memory 1 and the DDR memory controller 10 may be formed on one semiconductor chip.

The DDR memory 1 operates on the basis of an operation clock signal SCLK. In addition to a data signal DQ (DQ0 to DQi) indicating read data, the DDR memory 1 outputs a strobe signal DQS corresponding to the data signal DQ in a data read operation.

The DDR memory controller 10 outputs an operation clock signal SCLK to the DDR memory 1, and additionally has a function of switching the operation clock signal SCLK. Moreover, the DDR memory controller 10 has a function of receiving the data signal DQ and the strobe signal DQS from the DDR memory 1, and of outputting the data signal DQ to outside in response to the strobe signal DQS. To realize these functions, the DDR memory controller 10 includes a clock control circuit 20, an output circuit 30, a strobe delay circuit 40, and a DLL circuit 50. The configurations of the respective circuits will be described below.

In recent years, it is required to operate the DDR memory 1 at various operation frequencies according to necessity. That is, it is requested to dynamically change the operation clock signal SCLK of the DDR memory 1. A configuration to satisfy the request is the-clock control circuit 20.

The clock control circuit 20 receives a reference clock signal from outside of the DDR memory controller 10. The reference clock signal CLK is typically a system clock signal. The clock control circuit 20 generates a plurality of clock signals CLK1 to CLKn (n is an integer, and 2 or more) with frequencies different from each other, on a basis of the received reference clock signal. Furthermore, the clock control circuit 20 outputs one of the plurality of generated clock signals CLK1 to CLKn to the DDR memory 1 as the operation clock signal SCLK of the DDR memory 1.

To be more detailed, as shown in FIG. 2, the clock control circuit 20 includes a clock generating circuit 60 and a clock selecting circuit 70. The clock generating circuit 60 generates the plurality of clock signals CLK1 to CLKn with frequencies different from each other from the reference clock signal CLK. On the other hand, the clock selecting circuit 70 receives a frequency selection signal SEL in addition to the plurality of clock signals CLK1 to CLKn. The frequency selection signal SEL is a signal specifying the operation clock signal SCLK of the DDR memory 1, and is issued by a CPU. The clock selecting circuit 70 selects one of the plurality of clock signals CLK1 to CLKn as the operation clock signal SCLK in response to the frequency selection signal SEL, and outputs the selected operation clock signal SCLK to the DDR memory 1.

As described above, the clock control circuit 20 generates the plurality of clock signals CLK1 to CLKn and outputs the operation clock signal SCLK selected from among the clock signals based on the frequency selection signal SEL to the DDR memory 1. The DDR memory 1 operates on the basis of the selected operation clock signal SCLK. That is, the DDR memory 1 operates on the basis of either of a plurality of clock signals CLK1 to CLKn. It can be said that the plurality of clock signals CLK1 to CLKn generated by the clock control circuit 20 are candidates for the operation clock signal SCLK of the DDR memory 1.

Figure 3:
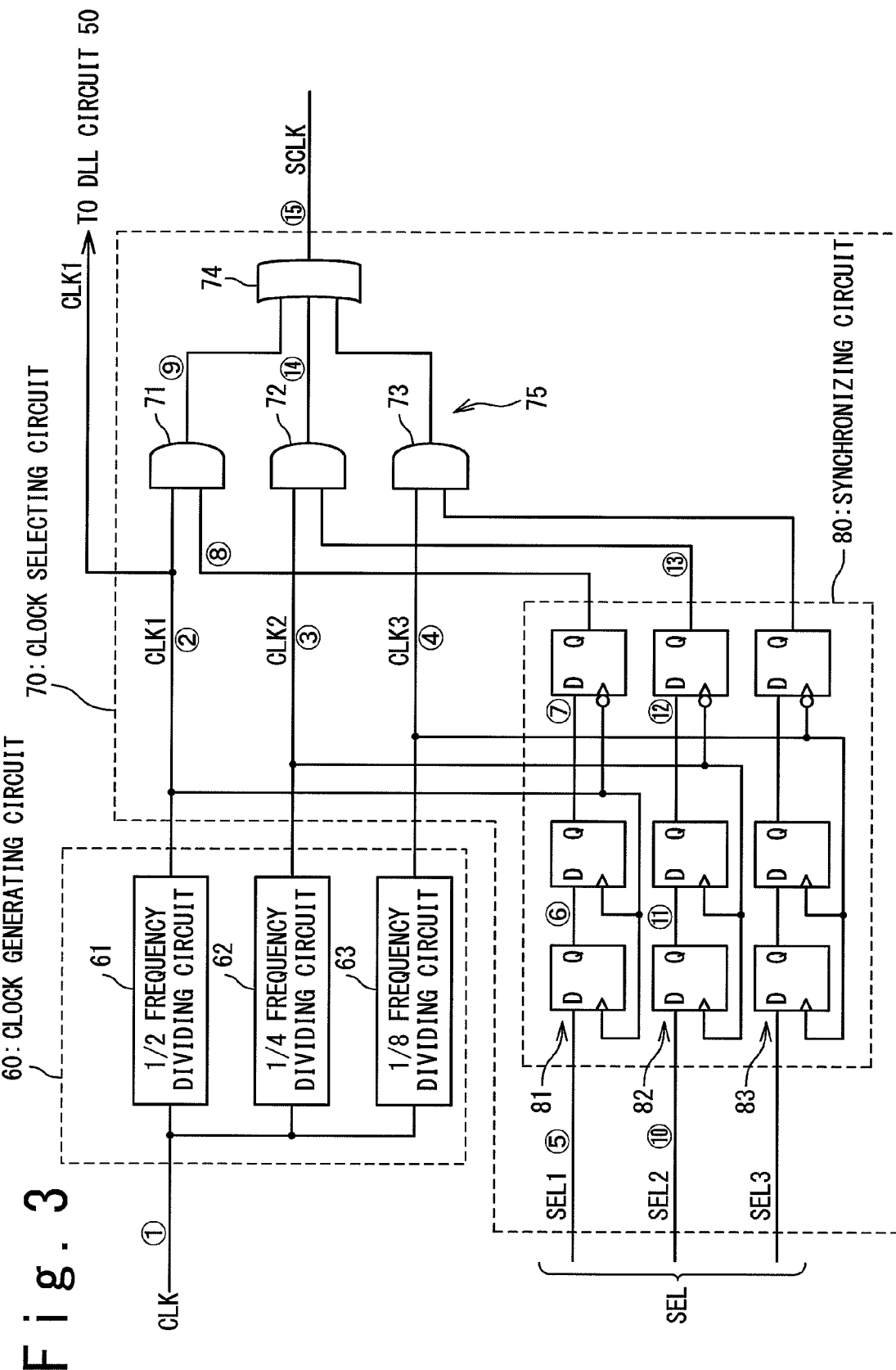
FIG. 3 is a circuit diagram showing a configuration of a clock control circuit.

FIG. 3 shows one example of a circuit configuration of the clock control circuit 20. In FIG. 3, the clock generating circuit 60 includes a plurality of frequency dividing circuits 61, 62, and 63. The respective frequency dividing circuits 61, 62, and 63 generate clock signals CLK1, CLK2, and CLK3 with frequencies different from each other from the reference clock signal CLK. For example, the respective frequency dividing circuits 61, 62, and 63 are a ½ frequency dividing circuit, a ¼ frequency dividing circuit, and a ⅛ frequency dividing circuit, respectively. In this case, the frequency of the clock signal CLK1 generated by the ½ frequency dividing circuit 61 is maximum, and the frequency of the clock signal CLK3 generated by the ⅛ frequency dividing circuit 63 is minimum. Meanwhile, as another example of the clock generating circuit 60, a configuration including a buffer through which an input clock signal (CLK) passes may be realized in addition to the frequency dividing circuits 61, 62, and 63.

The clock selecting circuit 70 receives the clock signals CLK1 to CLK3 and the frequency selection signal SEL. The frequency selection signal SEL includes a selection signal SEL1 indicating selection/non-selection state of the clock signal CLK1, a selection signal SEL2 indicating selection/non-selection state of the clock signal CLK2, and a selection signal SEL3 indicating selection/non-selection state of the clock signal CLK3. With the respective selection signals, it is assumed that a high level means the "selection state" and that a low level means the "non-selection state". Here, the selection signals SEL1, SEL2, and SEL3 are exclusively set so that a single clock signal can be selected from the plurality of clock signals CLK1 to CLK3.

In FIG. 3, the clock selecting circuit 70 includes a selecting circuit 75 and a synchronizing circuit 80. The synchronizing circuit 80 is a circuit for synchronizing the frequency selection signal SEL with each of the clock signals CLK1 to CLK3, and includes groups of flip-flops 81 to 83. Specifically, the flip-flop group 81 includes flip-flops connected in multiple stages and performs synchronization of the selection signal SEL1 by using the clock signal CLK1. In the same manner, the flip-flop group 82 includes flip-flops connected in multiple stages and performs synchronization of the selection signal SEL2 by using the clock signal CLK2, and the flip-flop group 83 includes flip-flops connected in multiple stages and performs synchronization of the selection signal SEL3 by using the clock signal CLK3. An example in which signals of a decoding result are supplied as the selection signals SEL (SEL1 to SEL3) has been shown here. However, the clock selecting circuit 70 may include a decoding circuit for decoding selection data to output the selection signals SEL (SEL1 to SEL3).

The selecting circuit 75 selects one of the clock signals CLK1 to CLK3 based on the frequency selection signals SEL (SEL1 to SEL3) outputted from the synchronizing circuit 80 and outputs the selected clock signal. For example, as shown in FIG. 3, the selecting circuit 75 includes AND circuits 71 to 73 and an OR circuit 74. The AND circuit 71 is supplied with the clock signal CLK1 and the selection signal SEL1 from the synchronizing circuit 80. The AND circuit 72 is supplied with the clock signal CLK2 and the selection signal SEL2 outputted from the synchronizing circuit 80. The AND circuit 73 is supplied with the clock signal CLK3 and the selection signal SEL3 outputted from the synchronizing circuit 80. Respective outputs of the AND circuits 71 to 73 are supplied to the OR circuit 74. A signal outputted from the OR circuit 74 is the operation clock signal SCLK of the DDR memory 1.

Figure 4:
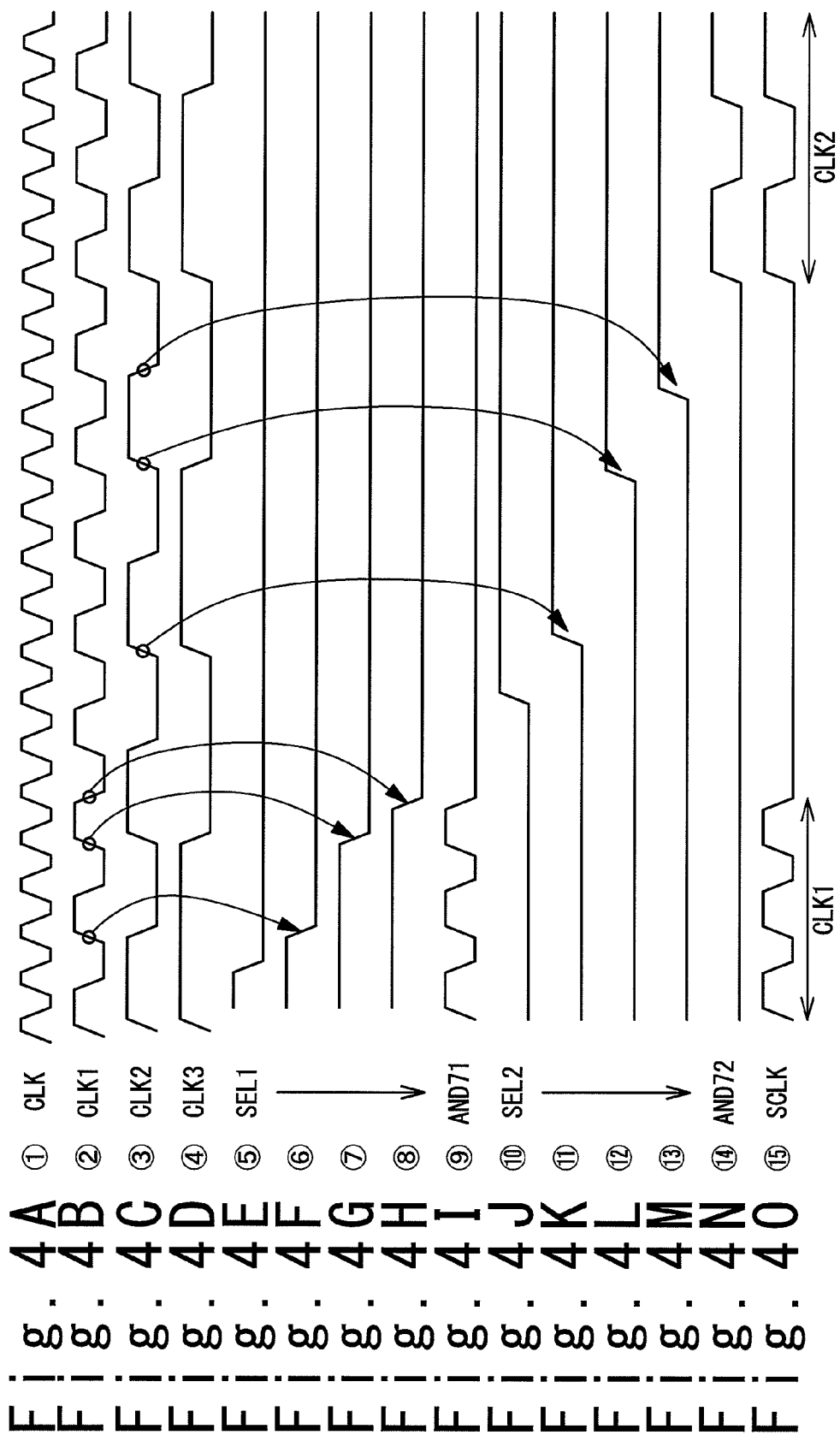
FIGS. 4A to 4O are timing charts showing an example of an operation of the clock control circuit 20 shown in FIG. 3.

FIGS. 4A to 4O are timing charts showing an example of an operation of the clock control circuit 20 shown in FIG. 3. The reference clock signal CLK, the clock signals CLK1 to CLK3, the selection signals SEL1, the output of the AND circuit 71, the selection signals SEL 2, the output of the AND circuit 72, and the selected operation clock signal SCLK are shown in FIGS. 4A to 4O. Numbers added to each column in FIGS. 4A to 4O mean the signals at positions indicated by the same numbers as those in FIG. 3, respectively.

In the example shown in FIGS. 4A to 4O, at first, only the selection signal SEL1 is in the high level and the remaining selection signals are in the low level. As the result, the clock signal CLK1 with a maximum frequency from among the clock signals CLK1 to CLK3 is selectively outputted from the clock control circuit 20 as the operation clock signal SCLK. After that, the selection signal SEL1 is changed into the L level. Subsequently, the selection signal SEL2 is changed from the low level into the high level. As the result, the clock signal CLK2 is selectively outputted from among the clock signals CLK1 to CLK3 from the clock control circuit 20 as the operation clock signal SCLK. As described above, the operation clock signal SCLK is switched from the clock signal CLK1 with a maximum frequency to the clock signal CLK2 with lower frequency than that.

Figure 5:
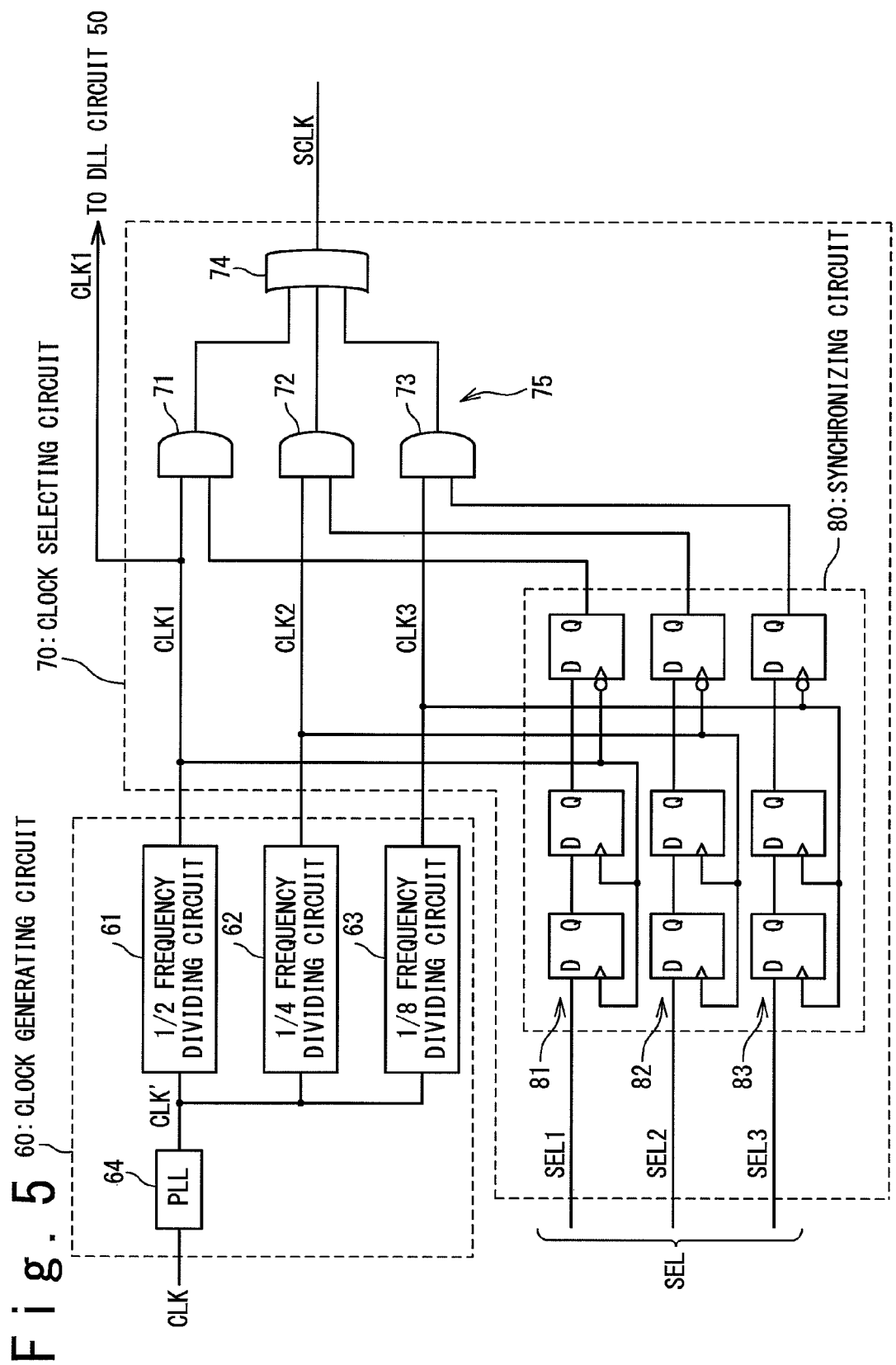
FIG. 5 is a circuit diagram showing another configuration of the clock control circuit.
Figure 6:
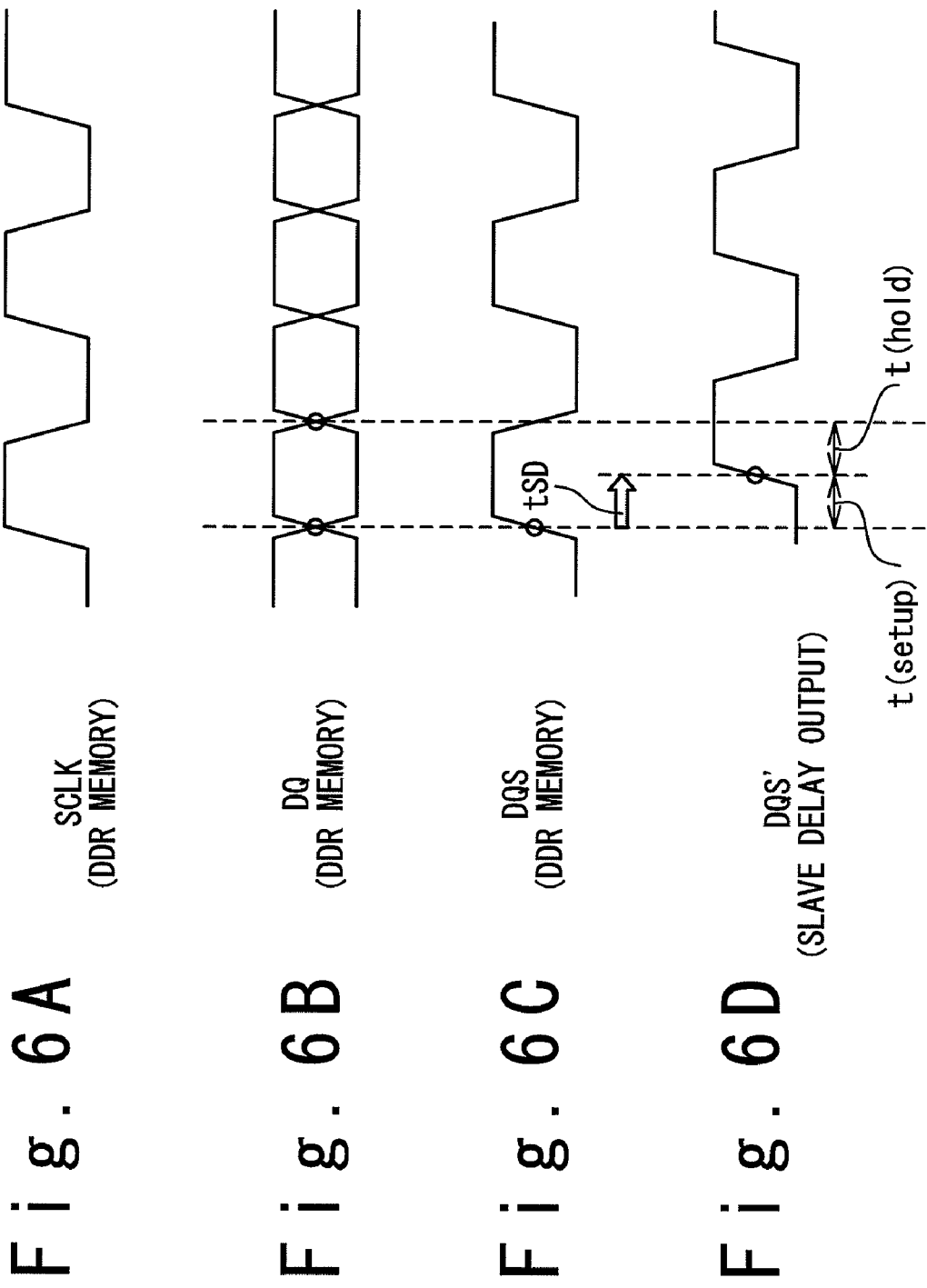
FIGS. 6A to 6D are timing charts showing a relation of a data signal DQ and strobe signals DQS and DQS'.
Figure 7:
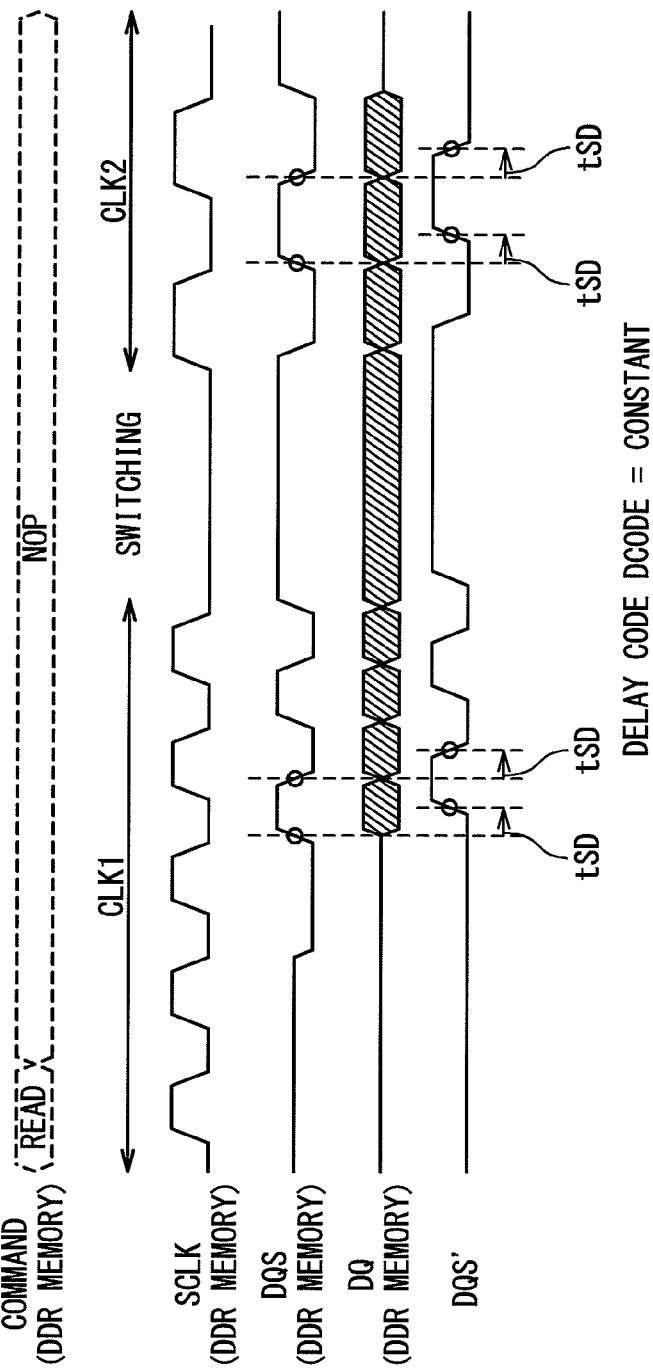
FIGS. 7A to 7E are timing charts showing a switching operation of an operation clock signal SCLK to supplied to a DDR memory.

FIG. 5 shows another example of a circuit configuration of the clock control circuit 20. In FIG. 5, a configuration of the clock selecting circuit 70 is the same as that shown in FIG. 3. On the other hand, the clock generating circuit 60 further includes a PLL circuit 64 in addition to the frequency dividing circuits 61 to 63. The PLL circuit 64 has a function for multiplying a frequency of the reference clock signal CLK. In this case, the respective frequency dividing circuits 61 to 63 generate the clock signals CLK1 to CLK3 from the multiplied reference clock signal CLK'. As described above, the clock control circuit 20 may generate the plurality of clock signals CLK1 to CLK3 after multiplying the reference clock signal CLK. A role to be played by the clock control circuit 20 is the same also in this case.

Referring to FIG. 2 again, an output circuit 30 and the strobe delay circuit 40 (the slave delay circuit) in the DDR memory controller 10 will be described.

The strobe signal DQS outputted from the DDR memory 1 is firstly supplied to the strobe delay circuit 40. The strobe delay circuit 40 is a circuit for delaying the strobe signal DQS received from the DDR memory 1 by a predetermined delay time (tSD). Specifically, the slave delay circuit 40 includes a variable delay circuit 41 including delay elements in multiple stages. The number of delay elements, that is, the delay time (tSD) changes on the basis of a "delay code DCODE" described later. Specifically, the strobe delay circuit 40 delays the strobe signal DQS by the delay time (tSD) depending on the delay code DCODE. The delayed strobe signal DQS is hereinafter referred to as a "strobe signal DQS'". The strobe signal DQS' is supplied to the output circuit 30.

The output circuit 30 receives the data signal DQ (DQ0 to DQi) outputted from the DDR memory 1. The data signal DQ is a signal of 8 bits (DQ0 to DQ7), for example. In addition, the output circuit 30 receives the strobe signal DQS' from the strobe delay circuit 40. The output circuit 30 latches the data signal DQ at timings of a rising edge or a falling edge of the strobe signal DQS' in response to the received strobe signal DQS'. Specifically, as shown in FIG. 2, the output circuit 30 includes flip-flops 31-0 to 31-$i$ and flip-flops 32-0 to 32-$i$. The flip-flops 31-0 to 31-$i$ are supplied with the strobe signal DQS'. The respective flip-flops 31-0 to 31-$i$ latch the data signals DQ0 to DQi at timing of the rising edge of the strobe signal DQS'. On the other hand, the flip-flops 32-0 to 32-$i$ are supplied with an inversion signal of the strobe signal DQS'. The respective flip-flops 32-0 to 32-$i$ latch the data signals DQ0 to DQi at timing of the falling edge of the strobe signal DQS'. Then, the output circuit 30 outputs the data signals DQ0 to DQi to outside of the DDR memory controller 10.

FIGS. 6A to 6D are timing charts showing a relation of the data signal DQ and the strobe signals DQS and DQS'. The DDR memory 1 operates in response to the above-mentioned operation clock signal SCLK, and outputs the data signal DQ and the strobe signal DQS. At this time, the strobe signal DQS toggles between the high level and the low level at each of output timing of the data signal DQ.

The strobe delay circuit 40 delays the strobe signal DQS for a predetermined delay time tSD in the DDR memory controller 10. As the result, the timings of the rising edge or the falling edge of the strobe signal DQS' outputted from the strobe delay circuit 40 are included in a period during which the data signal DQ is in a stable state. That is, a sufficient setup time t (setup) and hold time t (hold) will be ensured for the data signal DQ. As a result, the output circuit 30 can latch the data signal DQ in the period during which the data signal DQ is in the stable state. It should be noted that FIGS. 6A to 6D are shown under the assumption that a delay (skew) does not exist in the respective data signal DQ and strobe signal DQS. However, the skew is actually generated in the respective data signal DQ and strobe signal DQS as described later with reference to FIGS. 8A and 8B.

As described above, the DDR memory controller 10 can latch the data signal DQ in the stable state because the strobe delay circuit 40 delays the strobe signal DQS for the delay time tSD. On the contrary, the delay time tSD is set so that the data signal DQ can be latched in the stable state. The delay time tSD is determined based on the number of stages of the delay elements of the variable delay circuit 41, and the number of stages is set based on the delay code DCODE.

Here, it should be noted that a characteristic of the delay element changes depending on a temperature and a manufacture variation. That is, the delay time tSD may be varied based on the temperature and the manufacture variation even in case of identical delay code DCODE (the number of delay stages). In order to align the delay time tSD to a same value for respective semiconductor chips, it is required to adjust (trim) the delay code DCODE for the respective semiconductor chips. A configuration for performing trimming of the delay code DCODE is realized by the DLL circuit 50 described below.

Next, referring to FIG. 2 again, the DLL circuit 50 (the master DLL circuit) will be described. The DLL circuit 50 performs the trimming of the delay code DCODE specifying the delay time tSD in the strobe delay circuit 40 (the slave delay circuit) and determines an appropriate delay code DCODE.

In determining the delay code DCODE, the DLL circuit 50 according to the present embodiment uses as a reference clock signal REF, the "clock signal CLK1 with a maximum frequency" among the plurality of clock signals CLK1 to CLKn generated by the clock control circuit 20. That is, the DLL circuit 50 determines the delay code DCODE by using the clock signal CLK1 with the maximum frequency regardless of the operation clock signal SCLK of the DDR memory 1. For this reason, the DLL circuit 50 receives the clock signal CLK1 with the maximum frequency as the reference clock signal REF from the clock control circuit 20. Thus, the reference clock signal may be the clock signal supplied to the clock generating circuit 60.

As shown in FIG. 2, the DLL circuit 50 includes a variable delay circuit 51, a phase detector 52, a delay controller 53, and a code generation logic circuit 54. The variable delay circuit 51 is a replica of the variable delay circuit 41 included in the strobe delay circuit 40, and includes the delay elements in multiple stages. The number of stages of the delay elements (the stage number) will be changed depending on a control signal outputted from the delay controller 53. The variable delay circuit 51 receives the reference clock signal REF, and delays the reference clock signal REF for the delay time depending on the set stage number.

The phase detector 52 is supplied with the non-delayed reference clock signal REF and the delayed reference clock signal REF outputted from the variable delay circuit 51. The phase detector 52 compares the phases of the two reference clock signals REF and outputs a comparing result to the delay controller 53. The delay controller 53 generates a control signal on the basis of the comparing result and controls the variable delay circuit 51 to vary the number of stages of the delay elements.

By the variable delay circuit 51, the phase detector 52, and the delay controller 53, the number of delay stages at which a phase of the reference clock signal REF is shifted by 360 degrees (a single period) can be determined. The code generation logic circuit 54 is a dividing circuit that divides the number of delay stages by which a phase of the reference clock signal REF is shifted by 360 degrees, by a predetermined value. The code generation logic circuit 54 divides the above-mentioned number of delay stages by "4". As the result, the number of delay stages at which the phase of the reference clock signal REF is shifted by 90 degrees is calculated. In other words, the number of delay stages at which the phase of the clock signal CLK1 with the maximum frequency is shifted by 90 degrees is calculated.

A signal indicating the number of delay stages calculated in this way is the delay code DCODE. The DDL circuit 50 according to the present embodiment determines the delay code DCODE so that the phase of the clock signal CLK1 with the maximum frequency can be shifted by a predetermined angle (for example, 90 degrees). The above-mentioned strobe delay circuit 40 sets the number of delay stages on the basis of the determined delay code DCODE, and delays the strobe signal DQS for the delay time tSD. That is, the delay time tSD of the strobe signal DQS is adjusted (trimmed) so that the phase of the clock signal CLK1 with the maximum frequency is shifted by the predetermined angle (for example, 90 degrees).

As described above, according to the present embodiment, the reference clock signal REF supplied to the DLL circuit 50 is fixed to the clock signal CLK1 with the maximum frequency regardless of the operation clock signal SCLK supplied to the DDR memory 1. In other words, the delay code DCODE is determined by using the clock signal CLK1 with the maximum frequency as a reference clock signal of the clock signals CLK1 to CLKn which can be employed as the operation clock signal SCLK. As a result, the delay time tSD of the strobe signal DQS is adjusted to a value for which the phase of the clock signal CLK1 with the maximum frequency is shifted by a predetermined angle without depending on the operation clock signal SCLK. It should be noted that the delay code DCODE and the delay time tSD are not changed even when the operation clock signal SCLK of the DDR memory 1 is changed.

Next, an operation of the DDR memory controller 10 in switching the operation clock signal SCLK supplied to the DDR memory 1 will be described. FIGS. 7A to 7E are timing charts showing an example of switching of the operation clock signal SCLK. A command to the DDR memory 1, the operation clock signal SCLK, the strobe signal DQS and the data signal DQ outputted from the DDR memory 1, and the strobe signal DQS' outputted from the strobe delay circuit 40 are shown in FIGS. 7A to 7E.

In the example shown in FIGS. 7A to 7E, a read command (READ) is supplied to the DDR memory 1, and then a no-operation command (NOP) is supplied to the DDR memory 1. The DDR memory 1 reads data in response to the read command (READ). At this time, a burst length is 8.

The operation clock signal SCLK of the DDR memory 1 is the clock signal CLK1 with the maximum frequency at first. The DDR memory 1 outputs the strobe signal DQS and the data signal DQ in response to the clock signal CLK1 with the maximum frequency. The strobe signal DQS and the data signal DQ are outputted in a period of the NOP command. In the DDR memory controller 10, the strobe delay circuit 40 delays the strobe signal DQS for a predetermined delay time tSD. The delay time tSD is set to a value by which the phase of the clock signal CLK1 with the maximum frequency is shifted by a predetermined angle.

The frequency selection signal SEL is changed and the operation clock signal SCLK is switched at a certain timing during a period of the NOP command. For example, the operation clock signal SCLK is switched from the clock signal CLK1 with the maximum frequency to the clock signal CLK2 with the lower frequency than that of the clock signal CLK1. As shown in FIGS. 4A to 4O and 7A to 7E, the operation clock signal SCLK changes from the clock signal CLK1 into the clock signal CLK2 after a small time. After that, the DDR memory 1 outputs the strobe signal DQS and the data signal DQ on the basis of the clock signal CLK2.

It should be noted that the reference clock signal REF supplied to the DLL circuit 50 remains in the clock signal CLK1 with the maximum frequency. That is, re-trimming of the delay code DCODE is not performed in the DDL circuit 50, the delay code DCODE stays constant. Accordingly, the delay time tSD of the strobe signal DQS by the strobe delay circuit 40 do not change. The delay time tSD remains so that the phase of the clock signal CLK1 with the maximum frequency is shifted by a predetermined angle.

Figure 8:
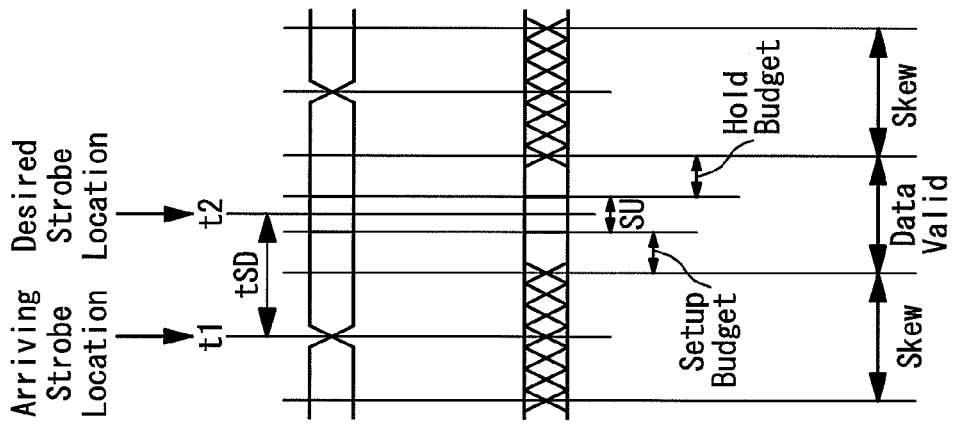
FIGS. 8A and 8B conceptually show timing budgets when an operation frequency of the DDR memory is a maximum frequency and when being not the maximum frequency.

FIGS. 8A and 8B conceptually show timing budgets when an operation frequency of the DDR memory 1 is a maximum frequency and when being not the maximum frequency. More specifically, the strobe signal DQS and the data signal DQ to be supplied to the DDR memory controller 10 are shown in FIGS. 8A and 8B. It is assumed that the strobe signal DQS reaches the DDR memory controller 10 at time t1. In addition, considering the skew, a period during which the data signal DQ is in a stable state is a period shown by "Data Valid" in the figure. It is desired that timing of an edge of the strobe signal DQS' is positioned at time t2 in the stable period of the data signal DQ. A difference between the time t2 and the above-mentioned time t1 is a desirable delay time tSD. However, in an actual delay circuit, there is a possibility that an error of the delay time tSD occurs. Considering such strobe uncertainty (SU), a setup budget and a hold budget can be defined as shown in FIGS. 8A and 8B.

As described above, according to the present embodiment, the delay code DCODE is trimmed by using the clock signal CLK1 with the maximum frequency. That is, the delay time tSD is set so that a setup/hold restriction is satisfied even in case that an operation frequency of the DDR memory 1 is a maximum.

Next, a case where the operation signal has a frequency other than a maximum frequency will be described. In this case, the delay code DCODE, that is, the delay time tSD is also the same as that in the case of the maximum frequency. For this reason, the setup budget is the same as that in the case of the maximum frequency, however, this is not a problem of an operation. On the other hand, the hold budget will necessarily be larger than that in the case of the maximum frequency as shown in FIGS. 8A and 8B. Naturally, this is not a problem of an operation. That is, since a timing budget at least equivalent to the case of the maximum frequency is ensured, a normal operation is assured.

As described above, since a sufficient timing budget is ensured even when any clock signal is selected as the operation clock signal SCLK supplied to the DDR memory 1, the DDR memory controller 10 can stably receive the data signal DQ. In other words, since the sufficient timing budget is assured, it is not required to retrim the delay code DCODE even when the operation clock signal SCLK is changed.

As described above, the delay code DCODE is determined by using the clock signal CLK1 with the maximum frequency among candidates which can be the operation clock signal SCLK supplied to the DDR memory 1. In this case, it is not required to retrim the delay code DCODE even when the operation clock signal SCLK supplied to the DDR memory 1 is changed. Accordingly, it is also not required to set the DDR memory 1 to a waiting state during the retrimming of the delay code DCODE in the DDR memory controller 10. When the frequency selection signal SEL is switched, the DDR memory 1 can immediately operate without waiting for the retrimming process on a controller side. Thus, a temporal overhead caused by a dynamic change of the operation clock signal SCLK is shortened. As a result, deterioration of the throughput is avoided and an operation speed is totally improved.

Figure 9:
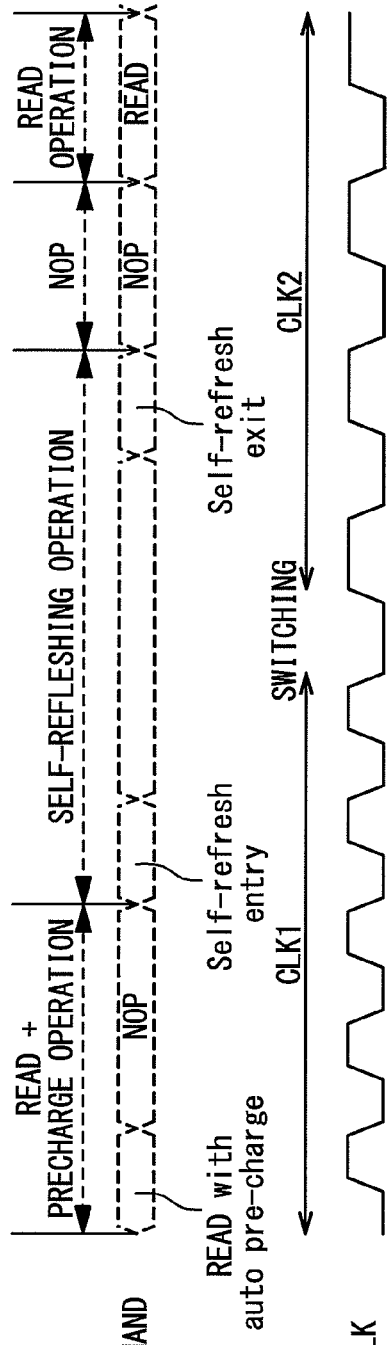
FIGS. 9A and 9B are timing charts showing another example of the switching operation of the operation clock signal supplied to the DDR memory.

In addition, the switch timing of the operation clock signal SCLK is not limited to the example shown in FIGS. 7A to 7E. The switch timing of the operation clock signal SCLK may arbitrarily be determined on the basis of a specification of a DDR memory 1 side. For example, it is considered that the specification of the DDR memory 1 permits the switching of the operation clock signal SCLK during a self-refreshing operation. In that case, as shown in FIGS. 9A and 9B, it is preferable that the operation clock signal SCLK is switched in the self-refreshing operation. Also, in an example shown in FIGS. 9A and 9B, a process of a DDR memory controller 10 is the same as that described above. That is, the DDR memory controller 10 can be universally applicable regardless of the specification of the DDR memory 1.

According to the present embodiment, a request of dynamically switching the operation clock signal SCLK supplied to the DDR memory 1 is satisfied by the clock control circuit 20.

In addition, the reference clock signal REF used in the trimming of the delay code DCODE is fixed to the clock signal CLK1 with the maximum frequency among the plurality of clock signals CLK1 to CLKn which can be the operation clock signal SCLK supplied to the DDR memory 1. In this case, it is not required to retrim the delay code DCODE even when the operation clock signal SCLK is changed. Accordingly, a temporal overhead caused through a dynamic switching of the operation clock signal SCLK is reduced. As a result, deterioration of the throughput is avoided and an operation speed is totally improved.

Second Embodiment

Figure 10:
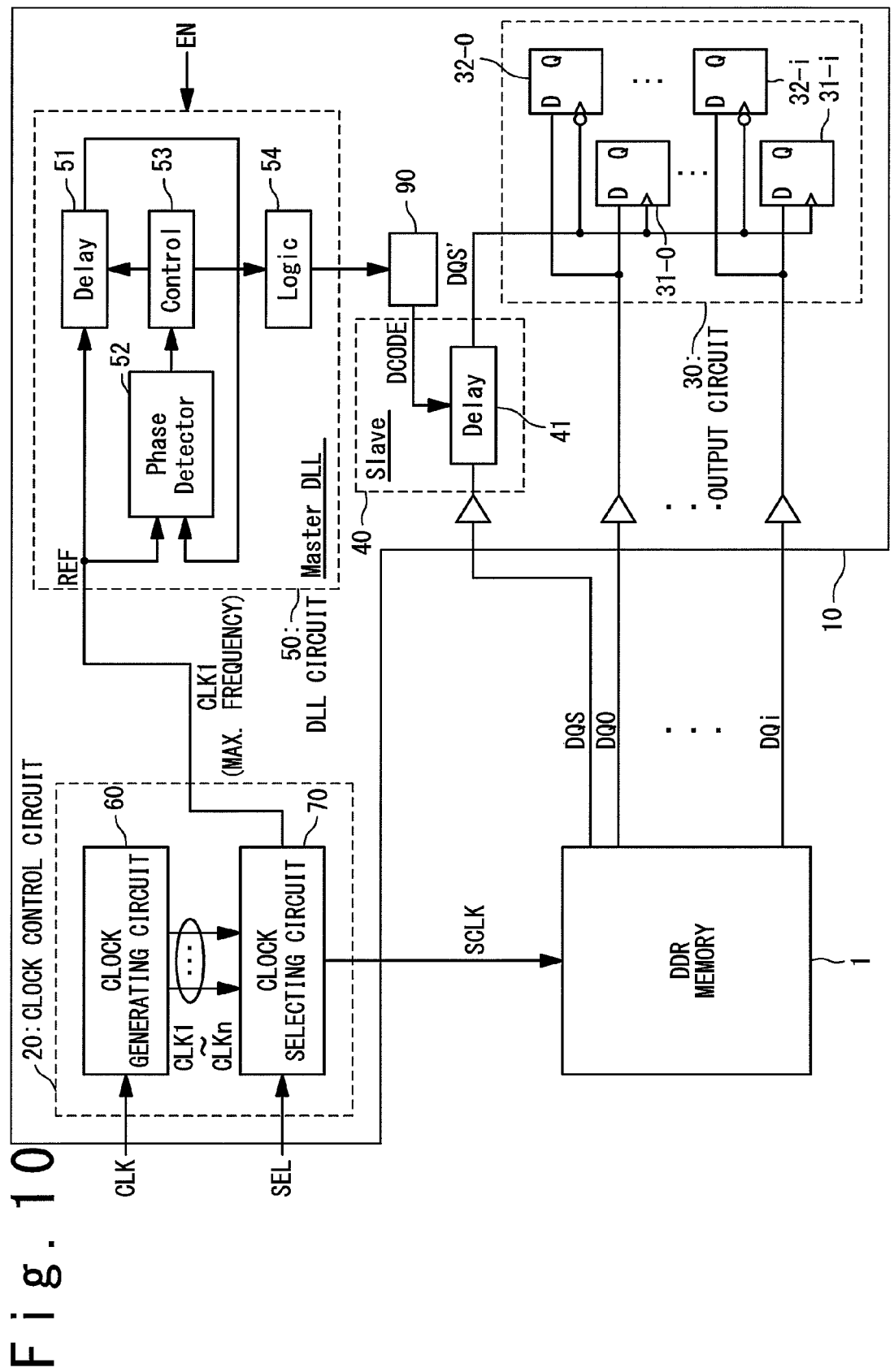
FIG. 10 is a block diagram showing a configuration of a semiconductor device according to a second embodiment of the present invention.

FIG. 10 is a block diagram showing a configuration of a semiconductor device according to a second embodiment of the present invention. The semiconductor device includes the DDR memory 1 and the DDR memory controller 10. In the present embodiment, the DDR memory controller 10 has a holding circuit 90 in addition to the configuration shown in FIG. 2. Other components are the same as those of the first embodiment, and redundant explanation will be arbitrarily omitted.

The holding circuit 90 is a memory circuit for holding the delay code DCODE, and is connected to the DLL circuit 5 and the strobe delay circuit 40. The DLL circuit 50 outputs the determined delay code DCODE to the holding circuit 90, and the holding circuit 90 holds the delay code DCODE determined by the DLL circuit 50. The delay code DCODE is outputted from the holding circuit 90 to the strobe delay circuit 40. The strobe delay circuit 40 delays the strobe signal DQS on the basis of the delay code DCODE held by the holding circuit 90.

As described in the first embodiment, it is not required to retrim the delay code DCODE even when the operation clock signal SCLK supplied to the DDR memory 1 is changed. Accordingly, the operation of the DLL circuit 50 can be stopped after the delay code DCODE has been determined once. Thus, the power consumption is reduced. For example, an enable signal EN is set to be the high level in an initialization of the DDR memory controller 10, and the DLL circuit 50 determines the delay code DCODE. After the determination of the delay code DCODE, the enable signal EN is set to be the low level, and the DLL circuit 50 is set to be a stand-by state. Thus, the toggle operation of the reference clock signal REF in the DLL circuit 50 is stopped and the consumed power can be substantially reduced. Since the delay code DCODE is outputted from the holding circuit 90 to the strobe delay circuit 40 even when the DLL circuit 50 is in the stand-by state, the strobe delay circuit 40 can delay the strobe signal DQS.

The present invention is not limited only to all the above-mentioned embodiments. For example, the above-mentioned variable delay circuits 41 and 51 may include the delay elements for fixed stages and vary an operation voltage of the delay elements (a power supply voltage) on the basis of a control signal outputted from the delay controller 53. For example, when the variable delay circuit 51 includes a delay circuit of 4 stages, a phase can be shifted by 90 degrees by the delay element for one stage.

In addition, in all the above mentioned embodiments, the clock generating circuit 60 is provided. When the plurality of clock signals with different frequencies can be prepared for the DDR memory controller of the present invention, it is natural that the clock selecting circuit 70 may directly receive the plurality of clock signals with different frequencies.

Furthermore, the semiconductor device including the above mentioned DDR memory 1 and the DDR memory controller 10 may be realized by mounting independent semiconductor integrated circuits (semiconductor chips) on a printed-circuit board (PCB). Alternately, the DDR memory chip and the semiconductor chip mounting the DDR memory controller 10 may be housed in one semiconductor package substrate as a SIP (System In Package). The semiconductor chips mounting the DDR memory chip and the DDR memory controller 10 of the desired number (1 or more) may be mounted.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A DDR memory controller comprising:
   a clock control circuit configured to output a clock signal selected from among a plurality of clock signals with different frequencies based on a frequency selection signal, to a DDR memory as an operation clock signal;
   a master DLL circuit configured to receive one of said plurality of clock signals which has a maximum frequency as a reference clock signal to determine a delay code; and
   a slave delay circuit configured to delay a strobe signal from said DDR memory based on the determined delay code to generate an internal strobe signal for a data signal from said DDR memory.

2. The DDR memory controller according to claim 1, wherein said clock control circuit comprises:
   a clock generating circuit configured to generate the plurality of clock signals from a reference clock signal.

3. The DDR memory controller according to claim 2, wherein said clock control circuit further comprises:
   a clock selecting circuit configured to select one of the plurality of clock signals based on the frequency selection signal and to output the selected clock signal to said DDR memory.

4. The DDR memory controller according to claim 2, wherein said clock control circuit comprises:
   a plurality of frequency dividing circuits, each of which generates one of the plurality of clock signals from the reference clock signal;
   a synchronizing circuit configured to synchronize the frequency selection signal with each of the plurality of clock signals; and
   a selecting circuit configured to select one of the plurality of clock signals based on the synchronized frequency selection signals.

5. The DDR memory controller according to claim 2, wherein said clock control circuit further comprises:
   a PLL circuit configured to frequency-multiply said reference clock signal to generate a PLL clock signal, and
   the plurality of clock signals are generated from the PLL clock signal.

6. The DDR memory controller according to claim 1, wherein the delay code is determined at initialization and kept during an active state even if the operation clock signal is changed.

7. The DDR memory controller according to claim 1, wherein said master DLL circuit further comprises:
   a holding circuit configured to hold the delay code,
   wherein said strobe delay circuit delays the strobe signal based on said delay code held by said holding circuit.

8. A DDR memory controller comprising:
  a clock control circuit configured to output one of a plurality of clock signals with different frequencies to a DDR memory as an operation clock signal; and
  a strobe delay circuit configured to delay a strobe signal outputted from said DDR memory by a predetermined delay time,
  wherein the delay time is adjusted such that a phase of one of the plurality of clock signals which has a maximum frequency is shifted by a predetermined angle.

9. The DDR memory controller according to claim 8, wherein said clock control circuit comprises:
  a clock generating circuit configured to generate the plurality of clock signal from a reference clock signal.

10. The DDR memory controller according to claim 8, further comprising:
  a DLL circuit configured to receive the clock signal with the maximum frequency from said clock control circuit, and to determine a delay code from the clock signal with the maximum frequency such that the phase of the clock signal with the maximum frequency is shifted by the predetermined angle,
  wherein said strobe delay circuit delays the strobe signal outputted from said DDR memory by the delay time based on the delay code.

11. The DDR memory controller according to claim 10, further comprising:
  a holding circuit configured to hold the delay code,
  wherein said strobe delay circuit delays the strobe signal based on said delay code held by said holding circuit.

12. The DDR memory controller according to claim 11, wherein said DLL circuit determines the delay code at initialization and keeps during an active state even if the operation clock signal is changed.

13. The DDR memory controller according to claim 8, wherein said clock control circuit further comprises:
  a clock selecting circuit configured to select one of the plurality of clock signals based on a frequency selection signal as the operation clock signal and to output the operation clock signal to said DDR memory.

14. A semiconductor integrated circuit comprising:
  a DDR memory; and
  a DDR memory controller,
  wherein said DDR memory controller comprises:
  a clock control circuit configured to output a clock signal selected from among a plurality of clock signals with different frequencies based on a frequency selection signal, to said DDR memory as an operation clock signal;
  a master DLL circuit configured to receive one of said plurality of clock signals which has a maximum frequency as a reference clock signal to determine a delay code; and
  a slave delay circuit configured to delay a strobe signal from said DDR memory based on the determined delay code to generate an internal strobe signal for a data signal from said DDR memory.

* * * * *